United States Patent

[11] 3,627,647

[72] Inventors James L. Reuter
East Fishkill;
Jagtar S. Sandhu, Fishkill, both of N.Y.
[21] Appl. No. 825,863
[22] Filed May 19, 1969
[45] Patented Dec. 14, 1971
[73] Assignee Cogar Corporation
Utica, N.Y.

[54] FABRICATION METHOD FOR SEMICONDUCTOR DEVICES
9 Claims, 2 Drawing Figs.

[52] U.S. Cl. .......... 204/15, 29/576, 204/42, 204/43, 204/56 R, 317/235 R
[51] Int. Cl. .......... C23b 5/48, C23b 5/46, C23b 5/32
[50] Field of Search .......... 204/43, 42, 44, 57, 56, 15

[56] References Cited

UNITED STATES PATENTS

| | | | |
|---|---|---|---|
| 3,360,695 | 12/1967 | Lindmayer | 317/234 |
| 3,368,113 | 2/1968 | Shaunfield | 317/101 |
| 3,402,081 | 9/1968 | Lehman | 148/188 |
| 3,445,924 | 5/1969 | Cheroff et al. | 29/571 |
| 3,447,238 | 6/1969 | Heynes et al. | 29/590 |
| 3,449,644 | 6/1969 | Nassibian | 317/235 |

OTHER REFERENCES

I.B.M. Journal, Sept. 1964, pgs. 422–426, Chemical & Ambient Effects on Surface Conduction in Passivated Silicon Semiconductors by H. S. Lehman.

*Primary Examiner*—John H. Mack
*Assistant Examiner*—T. Tufariello
*Attorney*—Harry M. Weiss

ABSTRACT: This disclosure relates to the formation of stable semiconductor devices by using a noble metal-silicon-oxygen alloy as a passivation type layer on a silicon dioxide layer located on one surface of a silicon substrate or device. The noble metal-silicon-oxygen alloy is deposited onto the semiconductor substrate surface during an anodization process preferably using a hydrogen peroxide solution containing from about 30 percent to about 0.1 percent hydrogen peroxide by volume in water. The anodization process serves to remove positive ion impurities from the silicon-silicon dioxide surface area which adversely affects the stability of the device. In one example, the noble metal-silicon-oxygen alloy is deposited primarily as a conductive layer while in another example, the noble metal-silicon-oxygen alloy is deposited as an insulating layer. For either example, the noble metal-silicon-oxygen alloy serves as a barrier to prevent impurities such as positive sodium ions from reaching the area of the silicon-silicon dioxide interface. This noble metal-silicon-oxygen layer is useful in various types of semiconductor devices including bipolar and unipolar devices.

PATENTED DEC 14 1971 3,627,647

INVENTORS
JAMES L. REUTER
JAGTAR S. SANDHU

BY Harry M Weiss
ATTORNEY

FABRICATION METHOD FOR SEMICONDUCTOR DEVICES

BACKGROUND OF THE INVENTION

Field of the Invention

This invention relates generally to semiconductor devices including fabrication methods therefor, and, more particularly, to stable semiconductor devices which use a noble metal-silicon-oxygen alloy passivating layer to achieve device stability.

Description of the Prior Art

In the past, the fabrication of stable semiconductor devices was a serious problem for semiconductor manufacturers due to the movement of positive charge carriers such as sodium ions to or near the surface of the semiconductor substrate thereby causing undesired inversion effects on the semiconductor substrate surface. One technique that was developed to overcome this positive ion contamination problem which caused unstable semiconductor devices to be formed was to use a layer of phosphosilicate glass ($P_2O_5$) over the semiconductor substrate surface which acted as a getter and a barrier to the sodium or other positive ions that caused the instability problem.

Another solution to the instability problem was the use of a thin layer of silicon nitride on an insulating layer located on the semiconductor substrate surface. The silicon nitride layer acts substantially as a barrier layer to positive ion contaminants located in the atmosphere that were likely to cause device instability by inversion of the substrate surface. The silicon nitride barrier layer was used either with or without the phosphosilicate glass layer. In any event, the silicon nitride layer was generally used on a thin insulating layer such as silicon dioxide because of silicon nitride incompatibility with the silicon substrate surface. However, with the use of the silicon nitride layer and/or the phosphosilicate glass layer for passivation purposes, the problem remained that the total insulating layer thickness, which included the underlying silicon dioxide layer, was sufficiently large that higher voltages had to be used, for example, for the gate electrode of an FET type device, than would have been necessary if the total dielectric material thickness was substantially the thickness of the underlying or supporting silicon dioxide layer. Additionally, another problem associated with the use of silicon nitride alone as a barrier layer without the use of a phosphosilicate glass layer for FET or bipolar type devices was that the silicon nitride barrier layer not only served as a barrier for preventing any positive charges or impurities from contaminating the semiconductor surface from outside the device, but also prevented these type of impurities that were on or close to the device surface from being gettered or removed from the vicinity of the semiconductor-insulator interface. Hence, a need existed for a process that would both remove the undesired positive charge impurities from the vicinity of the semiconductor surface and provide a barrier to external positive charge impurities.

SUMMARY OF THE INVENTION

Accordingly, it is an object of this invention to provide an improved, very stable, semiconductor device.

It is a further object of this invention to provide an improved process for fabricating a very stable semiconductor device.

It is a still further object of this invention to provide an improved FET type device including fabrication method therefor.

It is another object of this invention to provide an improved Bipolar type device including fabrication method therefor.

It is still another object of this invention to provide a passivating layer over a semiconductor surface which increases device stability.

DESCRIPTION OF THE PREFERRED EMBODIMENTS

In accordance with one embodiment of this invention, a semiconductor device comprises a semiconductor substrate having regions of opposite type conductivity located therein. An insulating layer is located on one surface of the substrate. The insulating layer is provided with openings therein which are formed by the usual photolithographic masking and etching techniques. A passivating layer is located on at least a portion of the insulating layer. The passivating layer consists of an alloy of silicon, oxygen and at least one noble metal selected from the group of metals consisting of platinum, gold, silver, rhodium, palladium and iridium. Preferably, the insulating layer is silicon dioxide and the noble metal of the passivating alloy layer is platinum. Electrodes are provided in contact with portions of the surface of the semiconductor substrate through the openings in the insulating layer.

In accordance with another embodiment of this invention, a process for fabricating a semiconductor device includes the formation of an insulating layer on one surface of a semiconductor substrate. Portions of the insulating layer are removed by conventional photolithographic masking and etching techniques to form openings therein. Regions of opposite type conductivity are formed in the semiconductor substrate by diffusion techniques using the insulating layer as a mask. A passivating layer is formed on at least a portion of the insulating layer by anodization. The passivating layer consists of an alloy of silicon, oxygen and at least one noble metal selected from the group of metals consisting of platinum, gold, silver, rhodium, palladium and iridium. Preferably, the noble metal is platinum which is the cathode in the anodization operation which, preferably, uses hydrogen peroxide in a concentration range of about 30 percent to about 0.1 percent by volume in water. Metal electrodes are formed to provide contact with portions of the surface of the semiconductor substrate through the openings in the insulating layer.

The foregoing and other objects, features and advantages of the invention will be apparent from the following more particular description of the preferred embodiments of the invention, as illustrated in the accompanying drawings.

BRIEF DESCRIPTION OF THE FIGURES

Referring to FIG. 1, step 1 of the FET fabrication process of this figure depicts a P-type substrate 10 having an insulating layer 12 located on one surface of the substrate 10. It should be evident to those skilled in the art that the fabrication process of this invention can be carried out with opposite type conductivity regions than the ones shown in the drawing. The P-type substrate 10 has an impurity concentration on the order of about $10^{16}$ impurities per cubic centimeter of a P-type dopant such as Boron. This starting semiconductor substrate can be formed by the usual crystal growth techniques which would comprise the formation of an elongated rod of single crystal material having a P-type dopant therein. The crystal rod is cut into a number of wafers which are then polished in preparation for the formation of the insulating layer 12 which is, preferably, silicon dioxide where a silicon crystal rod is used. The silicon dioxide insulating layer 12 is formed by the usual thermal oxide growth techniques or, if desired, can be formed by either pyrolitic, evaporation or sputtering processes.

Figure 1:
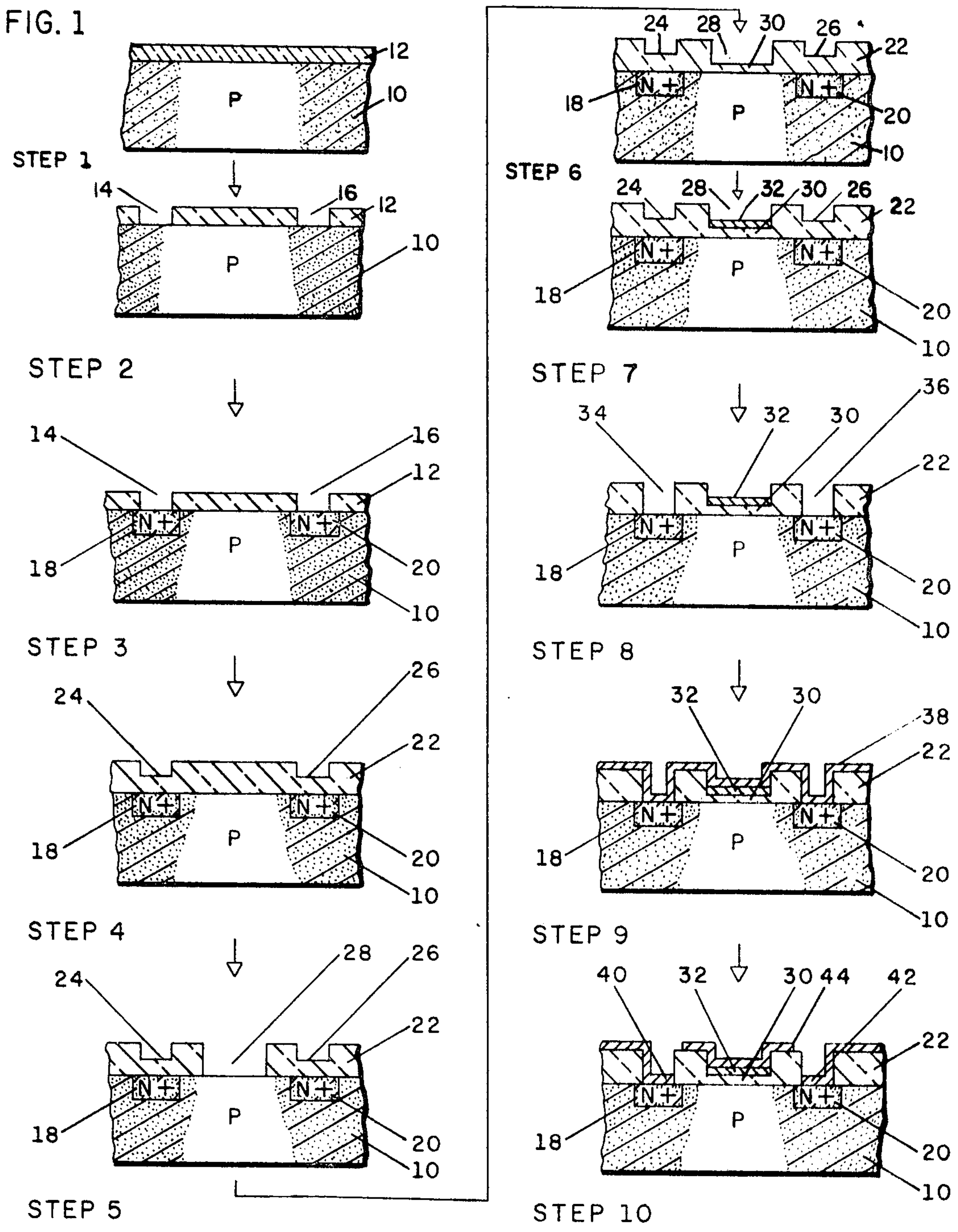
FIG. 1 is a flow diagram, in cross section, depicting the steps in the process for fabricating a field effect transistor device in accordance with this invention.

In step 2, by using conventional photolithographic masking and etching techniques, openings 14 and 16 are formed in the insulating layer 12 by using a suitable buffered HF solution.

In step 3, a conventional diffusion operation is carried out in order to form N+ regions 18 and 20, respectively, beneath openings 14 and 16. In this diffusion operation, an N-type dopant such as phosphorous or arsenic is used and the impurity concentration is on the order of about $10^{20}$ impurities per cubic centimeter. Region 18 serves as a source region and region 20 serves as a drain region for the FET device that is to be formed. However, if desired, these regions can be reversed in their function.

In step 4, an oxidation operation is carried out to thermally grow or deposit insulating layer 22 onto the substrate surface. This insulating layer 22 is an extension of the original insulating layer 12. Recesses 24 and 26 in the insulating layer 22 are located over the diffused regions 18 and 20 and thus aid in mask alignment for future process steps.

In step 5, by using conventional photolithographic masking and etching techniques, an opening 28 is formed in the insulating layer 22 between recesses 24 and 26 formed in the insulating layer 22.

In step 6, a thin silicon dioxide layer 30 is formed in the opening 28 by thermal oxide growth techniques. The thickness of this thin silicon dioxide layer is preferably about 75 A., but can be made to a thickness of a few hundred Angstroms. If desired, this thin oxide layer can be formed by evaporation, sputtering or pyrolitic techniques.

In step 7, a passivating alloy layer 32 containing a noble metal, silicon and oxygen, is deposited onto the thin silicon dioxide layer 30 by means of an anodization process using a hydrogen peroxide ($H_2O_2$) solution containing, by volume in water, an $H_2O_2$ concentration of from about 30 percent to about 0.1 percent. The metal cathode used in the anodization process is a noble metal. The noble metal of the passivating alloy layer 32 is at least one of the metals selected from the group consisting of platinum, gold, silver, rhodium, palladium and iridium. Preferably, platinum is used as the noble metal cathode and thus becomes the noble metal in the passivating alloy layer 32. $H_2O_2$ reacts with the cathode producing platinum oxide ions which codeposit in the anodized film to produce the alloy. The composition and conductivity of the anodized layer is easily controlled by controlling the $H_2O_2$ concentration, voltage and proximity of the electrode. If desired, other solutions can be used in the anodization process such as platinum chloride. Additionally, plasma anodization can also be employed to form the alloy layer 32 which would not require liquid solutions, but would use oxygen containing gaseous medium.

During the anodization process, the positive ions and/or the positive vacancies that cause undesired surface stability problems move away from the semiconductor-insulator interface area (including the gate region) in the direction of the cathode due to the field created in the anodization process. During the anodization step, the alloy layer 32 is only formed in the region above the thin oxide layer 30 without the necessity for masking due to the electric field provided by the P-region which is only shielded by the thin oxide. The noble metal-silcon-oxygen passivating alloy layer 32 is thus formed on the surface of the thin insulating layer 30 without the presence of the undesired positive ions at the silicon-silicon dioxide interface. By controlling the concentration of the hydrogen peroxide anodization solution, the first incremental portion of the alloy layer 32 that is formed on the thin insulating layer 30 can be an insulating layer to avoid a possible pinhole problem in the thin silicon dioxide layer 30 and the remaining portion of the alloy layer 32 can be a conductive layer thereby permitting the layer 32 to be, in effect, an electrode or electrical contact. Alternatively, the entire alloy layer 32 is formed as a conductive layer. By using a higher concentration of hydrogen peroxide, which is the oxygen source for the passivating alloy layer 32, more oxygen is provided for the alloy layer 32 thereby providing an insulating alloy layer due to the formation of nonconducting, metal oxides. Similarly, a smaller concentration of hydrogen peroxide makes the alloy more electrically conductive thereby acting as an electrode.

If desired, a post anodization annealing or heat treatment step is carried out to improve the electrical and mechanical contact between a gate metal and the thin insulating layer 30 through the intermediate alloy layer 32.

In step 8, openings 34 and 36 are formed in the insulating layer 22 over the regions 18 and 20, respectively, in order to provide ohmic contact thereto. These openings are formed by conventional photolithographic masking and etching techniques.

In step 9, a metal deposition operation is carried out to form a metal coating of ohmic contact type material such as aluminum on the semiconductor device surface. As shown in this view, the metal layer 38 forms an ohmic contact with the source region 18 and the drain region 20 as well as provides an electrical contact to the noble metal-silicon-oxygen alloy layer 32.

In step 10, by using photolithographic masking and etching techniques, the metal layer 38 is etched to provide ohmic contacts to the N+ type source region 18 and the N+ type drain region 20. A separate electrical contact is also provided above the gate region of the FET device of this figure. Accordingly, the ohmic contact to the N+ source region 18 is shown by contact 40, the ohmic contact to the N+ drain region 20 is shown by contact 42, and the metal contact or gate electrode for the gate region of the FET device is shown by metal electrode 44. The alloy layer 32 provides both a barrier layer to positive ion impurities from the external atmosphere in the vicinity of the gate electrode region which is very critical to device stability and performance and an electrically conducting region very close to the semiconductor substrate surface thereby substantially reducing the amount of voltage necessary to operate the FET device.

Figure 2:
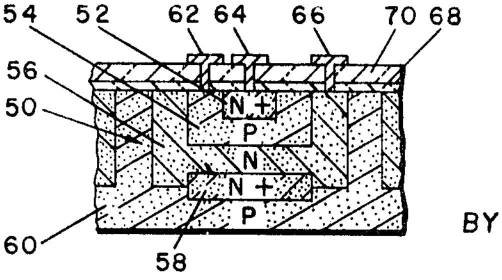
FIG. 2 is an elevational, cross-sectional view showing a bipolar or transistor semiconductor device having the improved passivating layer of this invention.

Referring to FIG. 2, a transistor device 50 is shown as part of an integrated semiconductor structure. Emitter region 52 is disposed within base region 54 which in turn is disposed within collector region 56. A sub collector region 58 is located beneath the base region 54 and spaced therefrom by a portion of the collector region 56. PN junction isolation of the transistor device 50 is achieved by P-type region 60 which surrounds the transistor device 50 and is electrically connected to a negative voltage source (not shown) to provide the PN junction isolation feature. Ohmic contacts, 62, 64, and 66 are, respectively, in contact with base region 54, emitter region 52, and collector region 56. The N+PN transistor device of FIG. 2 is provided with an $SiO_2$ insulating layer 68 on the surface thereof. Located on the insulating layer 68 is a noble metal-silicon-oxygen alloy layer 70 which is formed as an insulating layer by providing excess oxygen atoms in the alloy. The alloy layer 70 is formed during an annodization process as described above with reference to FIG. 1.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating a stable semiconductor device comprising the steps of:
   - forming an insulating layer on one surface of a semiconductor substrate;
   - removing portions of said insulating layer to form openings therein;
   - forming regions of opposite type conductivity in said semiconductor substrate;
   - forming a passivating layer by an anodization operation on at least a portion of said insulating layer, said passivating layer consisting of an alloy of silicon, oxygen and at least one noble metal selected from the group of metals consisting of platinum, gold, silver, rhodium, palladium and iridium;
   - and forming metal electrodes in contact with portions of the surface of said semiconductor substrate through said openings in insulating layer.

2. A method in accordance with claim 1, at least one noble metal being the cathode and said substrate being the anode.

3. A method in accordance with claim 2, wherein said noble metal is platinum.

4. A method in accordance with claim 2, wherein said passivating layer is formed as an insulating layer.

5. A method in accordance with claim 2, wherein said passivating layer is formed as an electrically conducting layer.

6. A method for fabricating a stable semiconductor device comprising the steps of:

thermally growing a silicon dioxide layer on one surface of a silicon semiconductor substrate;

photolithographically masking and etching away portions of said silicon dioxide layer to form openings therein;

diffusing impurities into said silicon substrate to form regions of opposite type conductivity therein;

forming a passivating layer by an anodization operation on at least a portion of said silicon dioxide layer, said passivating layer consisting of an alloy of silicon, oxygen, and at least one noble metal selected from the group of metals consisting of platinum, gold, silver, rhodium, palladium and iridium;

and forming metal electrodes in contact with portions of the surface of said silicon semiconductor substrate through said openings in said silicon dioxide layer.

7. A method in accordance with claimed 6, said noble metal being platinum and the cathode, and said substrate being the anode.

8. A method in accordance with claim 7, wherein hydrogen peroxide is the the anodization solution having a concentration in the range of about 30 percent to about 0.1 percent by volume in water.

9. A method for fabricating a stable semiconductor device including the step of:

depositing by anodization a passivating, stability-producing barrier layer over a surface of said device, said passivating layer consisting of an alloy of silicon, oxygen and a noble metal consisting of platinum, gold, silver, rhodium, palladium and iridium.

* * * * *